United States Patent
Hsu et al.

(10) Patent No.: US 9,847,393 B2
(45) Date of Patent: Dec. 19, 2017

(54) SEMICONDUCTOR DEVICE

(71) Applicant: UNITED MICROELECTRONICS CORP., Hsin-Chu (TW)

(72) Inventors: Yu-Ming Hsu, Changhua County (TW); Chun-Liang Kuo, Kaohsiung (TW); Tsang-Hsuan Wang, Kaohsiung (TW); Sheng-Hsu Liu, Changhua County (TW); Chieh-Lung Wu, Kaohsiung (TW); Chung-Min Tsai, Tainan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/286,541

(22) Filed: Oct. 5, 2016

(65) Prior Publication Data

US 2017/0133470 A1     May 11, 2017

Related U.S. Application Data

(63) Continuation of application No. 14/961,902, filed on Dec. 8, 2015, now Pat. No. 9,496,396.

(30) Foreign Application Priority Data

Nov. 10, 2015  (TW) .............................. 104136928 A

(51) Int. Cl.
| H01L 29/66 | (2006.01) |
|---|---|
| H01L 29/24 | (2006.01) |
| H01L 29/78 | (2006.01) |
| H01L 29/165 | (2006.01) |

(52) U.S. Cl.
CPC ............ H01L 29/24 (2013.01); H01L 29/165 (2013.01); H01L 29/66636 (2013.01); H01L 29/66795 (2013.01); H01L 29/7848 (2013.01)

(58) Field of Classification Search
None
See application file for complete search history.

(56) References Cited

U.S. PATENT DOCUMENTS

| 8,358,012 | B2 | 1/2013 | Haran et al. | |
|---|---|---|---|---|
| 9,293,534 | B2 | 3/2016 | Tsai | |
| 9,461,112 | B1* | 10/2016 | Lee | H01L 21/02381 |
| 2007/0262396 | A1* | 11/2007 | Zhu | H01L 21/76816 257/401 |
| 2011/0117732 | A1 | 5/2011 | Bauer | |
| 2012/0289009 | A1* | 11/2012 | Yeh | H01L 21/30608 438/198 |
| 2013/0309829 | A1* | 11/2013 | Fang | H01L 21/26506 438/285 |
| 2014/0134818 | A1* | 5/2014 | Cheng | H01L 29/66636 438/300 |
| 2014/0346576 | A1 | 11/2014 | Lu | |

(Continued)

*Primary Examiner* — Ali Naraghi
(74) *Attorney, Agent, or Firm* — Winston Hsu

(57) ABSTRACT

A semiconductor device is disclosed. The semiconductor device includes: a substrate, a gate structure on the substrate, a spacer adjacent to the gate structure, an epitaxial layer in the substrate adjacent to two sides of the spacer, and a dislocation embedded within the epitaxial layer. Preferably, the top surface of the epitaxial layer is lower than the top surface of the substrate, and the top surface of the epitaxial layer has a V-shape.

3 Claims, 3 Drawing Sheets

(56) References Cited

U.S. PATENT DOCUMENTS

| | | | |
|---|---|---|---|
| 2015/0044622 A1 | 2/2015 | Yang | |
| 2015/0132913 A1* | 5/2015 | Hong | H01L 29/0847 438/285 |
| 2015/0206939 A1* | 7/2015 | Huang | H01L 29/66628 257/77 |
| 2015/0318212 A1* | 11/2015 | Tsai | H01L 29/66636 438/299 |
| 2016/0035892 A1* | 2/2016 | Yu | H01L 29/7847 438/285 |

* cited by examiner

SEMICONDUCTOR DEVICE

CROSS REFERENCE TO RELATED APPLICATIONS

This is a continuation application of U.S. patent application Ser. No. 14/961,902, filed on Dec. 8, 2015, and all benefits of such earlier application are hereby claimed for this new continuation application.

BACKGROUND OF THE INVENTION

1. Field of the Invention

The invention relates to a semiconductor device, and more particularly, to a semiconductor device having dislocation embedded within epitaxial layer.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

Conventionally, dislocations are easily formed during the formation of epitaxial layer through epitaxial growth processes, and accumulation of dislocations will often result in much more serious linear dislocations and affect optical and electrical performance of a material. Hence, how to improve the current fabrication to resolve this issue has become an important task in this field.

SUMMARY OF THE INVENTION

According to a preferred embodiment of the present invention, a method for fabricating semiconductor device is disclosed. The method includes the steps of: (a) providing a substrate; (b) forming a gate structure on the substrate; (c) performing a first deposition process to form a first epitaxial layer adjacent to the gate structure and performing a first etching process to remove part of the first epitaxial layer at the same time; and (d) performing a second etching process to remove part of the first epitaxial layer.

According to another aspect of the present invention, a semiconductor device is disclosed. The semiconductor device includes: a substrate; a gate structure on the substrate; an epitaxial layer adjacent to the gate structure; and a dislocation embedded within the epitaxial layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
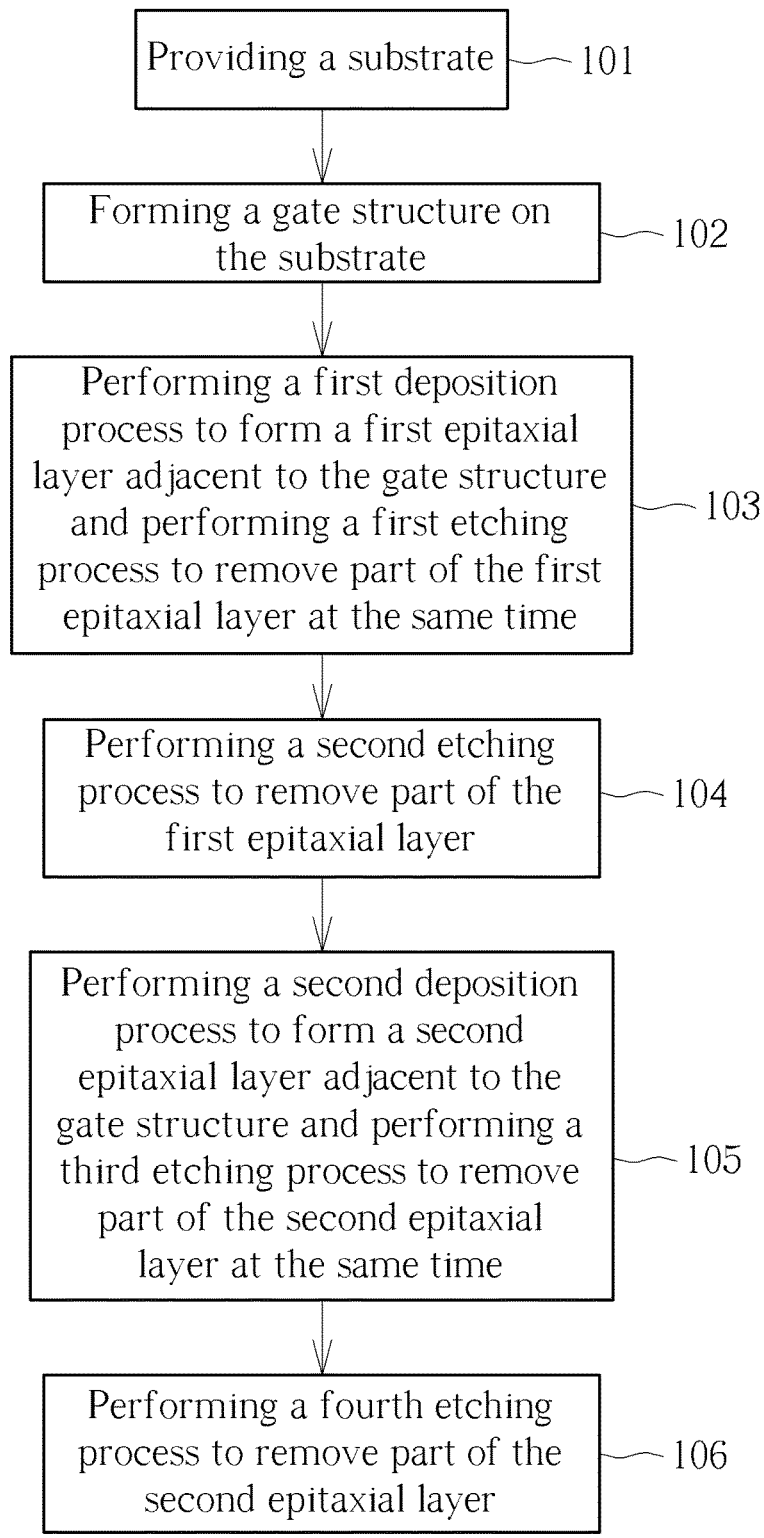
FIG. 1 is a flow chart diagram illustrating a method for fabricating semiconductor device according to a preferred embodiment of the present invention.
Figure 2:
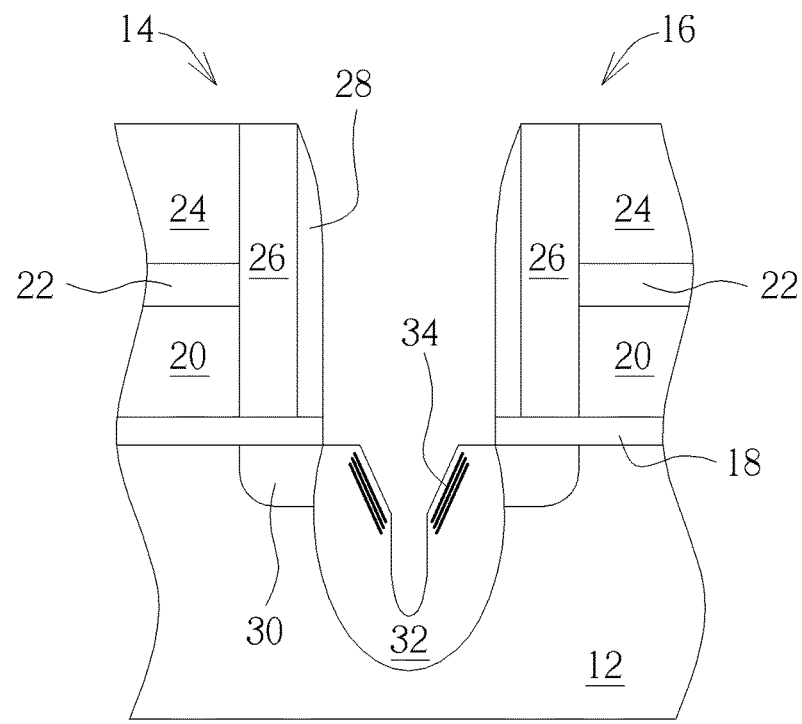
FIGS. 2-5 are perspective diagrams illustrating a method for fabricating semiconductor device according to the preferred embodiment of the present invention.

Referring to FIG. 1 and FIGS. 2-5, FIG. 1 is a flow chart diagram illustrating a method for fabricating semiconductor device according to a preferred embodiment of the present invention and FIGS. 2-5 are perspective diagrams illustrating a method for fabricating semiconductor device according to the preferred embodiment of the present invention. As shown in FIGS. 1-2, step 101 is first performed to provide a substrate 12, and step 102 is performed to form gate structures 14 and 16 on the substrate 12. In this embodiment, the formation of the gate structures 14 and 16 could be accomplished by sequentially forming a gate dielectric layer 18, a gate material layer, a first hard mask, and a second hard mask on the substrate 12, and then performing a pattern transfer process by using a patterned resist (not shown) as mask to remove part of the second hard mask, part of the first hard mask, and part of the gate material layer through single or multiple etching processes. This forms gate structures 14 and 16 on the substrate 12, in which each of the gate structures 14 and 16 includes a patterned material layer 20, a patterned hard mask 22, and a patterned hard mask 24. It should be noted that even though two gate structures 14 and 16 are disclosed in this embodiment, the quantity of the gate structures 14 and 16 is not limited to two, but could be any quantity depending on the demand of the product. Moreover, in order to emphasize the epitaxial layer formed between the gate structures 14 and 16 afterwards, only part of the gate structures 14 and 16 are shown in this embodiment, such as the right portion of gate structure 14 and the left portion of gate structure 16.

In this embodiment, the substrate 12 could be a semiconductor substrate such as a silicon substrate, an epitaxial silicon substrate, a silicon carbide substrate, or a silicon-on-insulator (SOI) substrate. The gate dielectric layer 18 could be composed of $SiO_2$, SiN, or high dielectric constant material. The gate material layer could be composed of conductive material including metals, polysilicon, or silicides. The hard mask 22 is preferably composed of silicon nitride and the hard mask 24 is composed of silicon oxide. It should be noted that even though the hard mask 24 composed of silicon oxide is disposed on the hard mask 22 composed of silicon nitride in this embodiment, the materials of the hard mask 22 and 24 are not limited to this combination. For instance, the hard masks 22 and 24 could be selected from the group consisting of $SiO_2$, SiN, SiC, and SiON while the two hard masks 22 and 24 are composed of different material, which is also within the scope of the present invention.

According to an embodiment of the present invention, it would also be desirable to form multiple doped wells (not shown) and/or shallow trench isolations (STI) in the substrate 12. Moreover, despite that the present invention pertains to a planar transistor, it would also be desirable to employ the process of this embodiment to a non-planar transistor such as a FinFET, and in such instance, the substrate 12 disclosed in FIG. 1 would become a fin-shaped structure on a substrate.

Next, at least a spacer is formed on the sidewalls of the gate structures 14 and 16, in which the spacer includes an offset spacer 26 and a spacer 28. A lightly doped ion implantation is then conducted with a rapid thermal anneal process at approximately 930° C. to activate the implanted dopants within the substrate 12 for forming a lightly doped drain 30 in the substrate 12 adjacent to two sides of the spacer 28. In this embodiment, the offset spacer 26 preferably includes SiCN and the spacer 28 preferably includes SiN, but not limited thereto. For instance, the spacers 26 and 28 could be selected from the group consisting of $SiO_2$, SiN, SiON, and SiCN while the spacers 26 and 28 are composed of different material.

Next, a dry etching and/or wet etching process is conducted by using the gate structures 14 and 16 and spacer 28 as mask to remove part of the substrate 12 along the spacer 28. This forms a recess (not shown) in the substrate 12 adjacent to two sides of the gate structures 14 and 16.

Next, step 103 is conducted by performing a first deposition process to form a first epitaxial layer 32 in the recess adjacent to the gate structures 14 and 16 and performing a first etching process to remove part of the first epitaxial layer 32 at the same time. It should be noted that the first epitaxial layer 32 of this embodiment preferably includes silicon phosphide (SiP), and due to the different lattice constant between phosphorus and silicon, dislocation 34 is typically formed during the growth of epitaxial layer, such as during the aforementioned first deposition process. When large quantities of dislocations were formed, linear dislocations are observed in the epitaxial layer and electrical and optical property of the material is affected significantly.

In order to reduce the formation of dislocations in epitaxial layer, a first etching process is usually conducted after the aforementioned first deposition process to remove part of the first epitaxial layer 32 and part of the dislocation 34 in the first epitaxial layer 32.

In this embodiment, the first deposition process is preferably accomplished by injecting silicon-containing gas such as dichlorosilane (DCS) to form the first epitaxial layer 32 in the recess, and the first etching process conducted thereafter is preferably accomplished by injecting chlorine-containing gas such as hydrochloric acid (HCl) to remove part of the first epitaxial layer 32 and dislocation 34.

Figure 3:
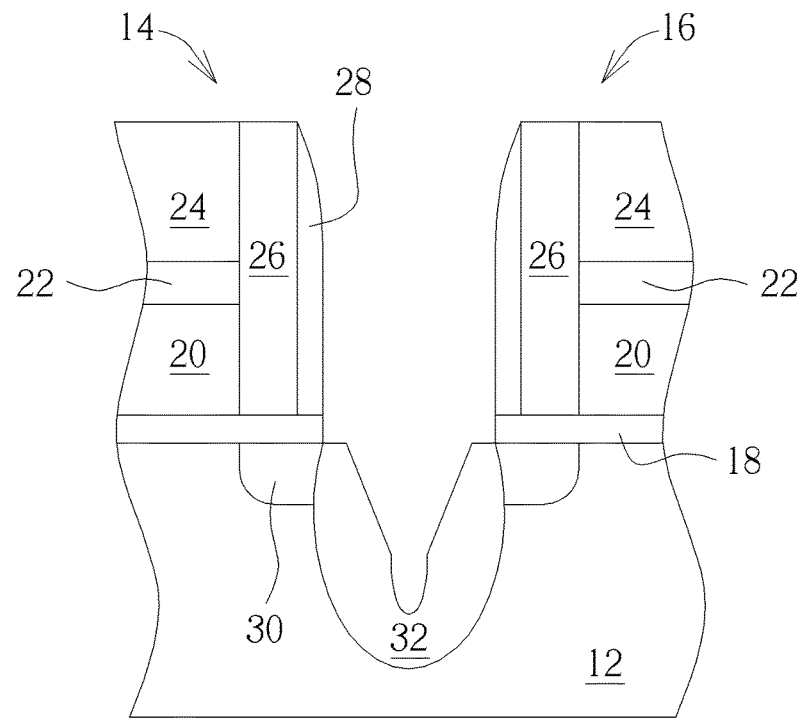

Next, as shown in FIG. 3, step 104 is conducted by performing a second etching process to remove part of the first epitaxial layer 32 once more. Since the first etching process conducted in FIG. 2 is unlikely to remove all of the dislocation 34 formed during first deposition process completely, step 104 preferably conducts another etching process without additional deposition process to remove the dislocation 34 on the first epitaxial layer 32. In this embodiment, the etching gas of the second etching process could be the same as or different from the etching gas of the first etching process. For instance, the second etching process could be accomplished by using gas such as HCl to remove the remaining dislocation 34.

Figure 4:
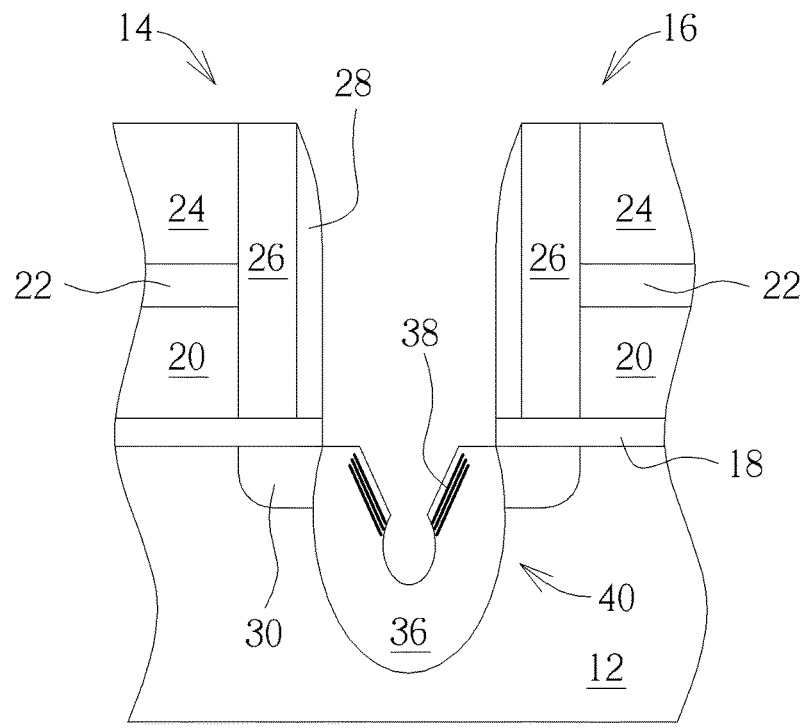

Next, as shown in FIG. 4, steps 103 and 104 could be repeated or step 105 is conducted by performing a second deposition process to form a second epitaxial layer 36 adjacent to the gate structures 14 and 16 and performing a third etching process to remove part of the second epitaxial layer 36 at the same time. Similar to the first deposition process and first etching process conducted in FIG. 2, the second deposition process is preferably accomplished by injecting gas such as DCS to form the second epitaxial layer 36 on the first epitaxial layer 32 thereby constituting an epitaxial layer 40, and the third etching process is preferably accomplished by injecting gas such as HCl to remove part of the dislocation 38 generated during the second deposition process.

Referring again to FIG. 4, which further illustrates a structural view of a semiconductor device according to a preferred embodiment of the present invention. As shown in FIG. 4, the semiconductor device includes a substrate 12, gate structures 14 and 16 on the substrate 12, an epitaxial layer 40 in the substrate 12 adjacent to the gate structures 14 and 16, and at least a dislocation 38 dislocation defects embedded within the epitaxial layer 40.

In this embodiment, the epitaxial layer 40 preferably includes SiP, the top surface of the epitaxial layer 40 includes a substantially V-shaped profile, and part of the top surface of the epitaxial layer 40 is lower than the top surface of the substrate 12. Specifically, the dislocation 38 is embedded in the epitaxial layer 40 under the V-shaped profile of the epitaxial layer 40, and the surface of the V-shaped profile of epitaxial layer 40 does not include any dislocation 38. It should be noted that the dislocation 38 embedded within the epitaxial layer 40 also has a substantially V-shaped profile so that the V-shaped profile of the epitaxial layer 40 surface and the V-shaped profile of the dislocation 38 are substantially parallel.

Figure 5:
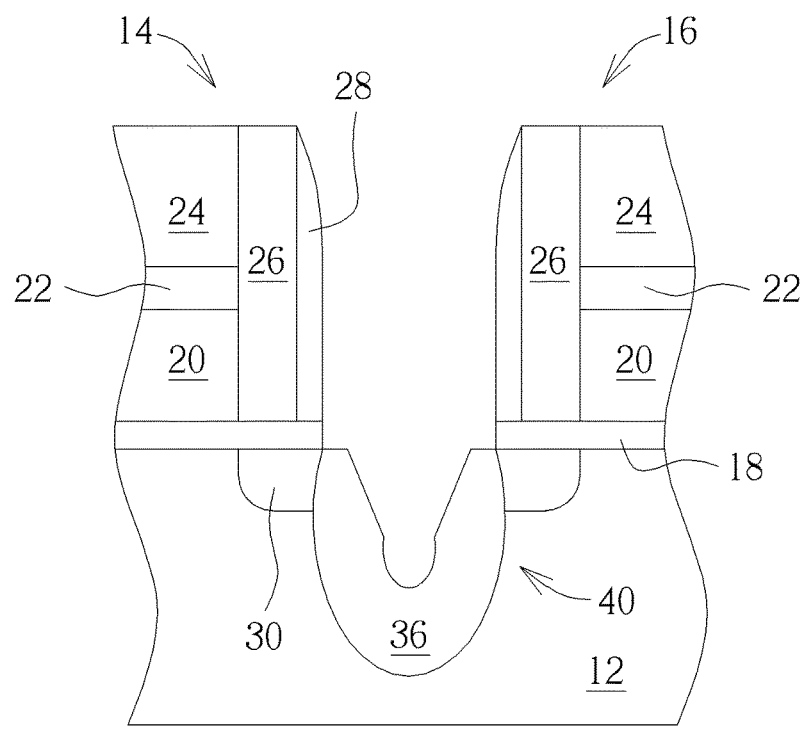

Next, after the third etching process is conducted, as shown in FIG. 5, step 106 is conducted by performing a fourth etching process to remove part of the second epitaxial layer 36 once again. Similar to the second etching process performed in FIG. 3, the fourth etching process is accomplished by using etching gas such as HCl to completely remove the dislocation 38 remained from the third etching process without carrying out any additional deposition process.

It should be noted that in this embodiment, the duration of step 103 is preferably greater than the duration of step 105, and the duration of step 104 is preferably greater than the duration of step 106. In other words, the duration of the first deposition process used to form first epitaxial layer 32 along with the first etching process to remove part of the first epitaxial layer 32 conducted in step 103 is preferably greater than the duration of the second deposition process used to form second epitaxial layer 36 along with the third etching process used to remove part of the second epitaxial layer 36 conducted in step 105, and the duration of the second etching process used to remove part of the first epitaxial layer 32 and dislocation 34 is preferably greater than the duration of fourth etching process used to remove part of the second epitaxial layer 36 and dislocation 38.

Next, typical semiconductor fabrication processes could be carried out by forming contact etch stop layer (CESL) on the substrate 12 to cover the gate structures 14 and 16, forming an interlayer dielectric (ILD) layer, and forming contact plugs in the ILD layer to electrically connect to the epitaxial layer 40. This completes the fabrication of a semiconductor device according to a preferred embodiment of the present invention.

Overall, in contrast to conventional art of performing a deposition process to form epitaxial layer and etching part of the epitaxial layer at the same time, the present invention preferably performs an additional etching process after the aforementioned deposition and etching combination to ensure that all of the remaining dislocations within the epitaxial layer are removed completely. Preferably, the deposition and etching process combination and the additional etching process conducted thereafter could further be repeated to ensure that all of the dislocations are removed completely.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor device, comprising:
   a substrate;
   a gate structure on the substrate;
   an epitaxial layer adjacent to the gate structure, wherein a top surface of the epitaxial layer comprises a V-shape having a first side extending along a first direction and a second side extending along a second direction; and
   a first dislocation and a second dislocation embedded completely within the epitaxial layer, wherein the first dislocation is extending along the first direction and the second dislocation is extending along the second direction.

2. The semiconductor device of claim 1, wherein the top surface of the epitaxial layer is lower than the top surface of the substrate.

3. The semiconductor device of claim 1, wherein the epitaxial layer comprises SiP.

* * * * *